United States Patent [19]

Grob

[11] 4,268,792

[45] May 19, 1981

[54] METHOD OF AND APPARATUS FOR MULTIPLYING PULSES

[75] Inventor: Russel W. Grob, Metamora, Ill.

[73] Assignee: Caterpillar Tractor Co., Peoria, Ill.

[21] Appl. No.: 106,817

[22] Filed: Dec. 26, 1979

Related U.S. Application Data

[62] Division of Ser. No. 808,834, Jun. 22, 1977.

[51] Int. Cl.³ .......................... H03K 5/00; H03K 5/26
[52] U.S. Cl. ........................................ 328/24; 328/15; 328/25; 307/271
[58] Field of Search ............................ 328/15, 24, 25; 307/232, 271

[56] References Cited

U.S. PATENT DOCUMENTS

| 3,382,443 | 5/1968 | Miller | 328/24 |
| 3,582,812 | 6/1971 | Kochi | 328/25 |
| 3,671,871 | 6/1972 | Malm | 328/25 |
| 3,970,954 | 7/1976 | Even | 328/15 |

Primary Examiner—John S. Heyman
Attorney, Agent, or Firm—Wegner, Stellman, McCord, Wiles & Wood

[57] ABSTRACT

A method of and an apparatus for converting a first series of pulses into a second series of pulses having a frequency proportional to the frequency of the first series. The method and apparatus are particularly useful for providing a series of equally spaced pulses representative of the speed of a rotating gear in revolutions per minute (RPM). A proximity detector provides a pulse as each tooth of the gear traverses the face of the proximity detector and a sample period is formed by the passing of several teeth. A series of pulses is counted by a counter for the length of the sample period. The number of pulses at the end of the sample period is stored in a latch. A programed divider counts down from the count in the latch to zero at a reference frequency and an output pulse is provided each time the programed divider reaches zero. The programed divider is reset to the count in the latch upon the occurrence of each output pulse. In a specific application, the number of output pulses from the counter is made equal to the number of pulses that would be generated by a gear having sixty teeth and rotating at the same speed for convenient display of RPM on a digital counter with a one-second time base.

4 Claims, 2 Drawing Figures

METHOD OF AND APPARATUS FOR MULTIPLYING PULSES

DESCRIPTION

Cross Reference to Related Application

This is a division of application Ser. No. 808,834 filed June 22, 1977.

BACKGROUND OF THE INVENTION

This invention relates to a method of and an apparatus for converting a first series of pulses into a second series of pulses having a frequency proportional to the first series and, more particularly, to an instrument for measuring the velocity of a rotating element and converting the series of pulses representative of the rotational velocity into a form which can be easily displayed by an RPM meter.

Accurate measurement of the velocity of a rotating gear is desirable. When convenient, a sixty-tooth gear is included in or connected to the rotating system. A proximity detector sensing the teeth of the sixty-tooth gear is coupled to an electronic counter having a one-second time base. This provides a direct reading of RPM. However, if a sixty-tooth gear (or multiple thereof) is not available, a variable time base counter must be used to convert the number of pulses received from the gear into a form readable by the electronic counter having the one-second time base. Adjustment of the time base is required and the accuracy of the system depends upon the adjustment of the time base. Adjustable time base counters are expensive and are often not readily available.

I have developed a method and apparatus for converting the pulses from a gear to the number of pulses which would be generated by a gear having sixty teeth and rotating at the same velocity as the gear being measured.

SUMMARY OF THE INVENTION

The present invention is directed to overcoming one or more of the problems as set forth above.

A method of and an apparatus for converting a first series of pulses into a second series of pulses having a frequency proportional to the first series is provided. The method and apparatus are particularly useful in providing a series of equally spaced pulses representative of the velocity of a rotating gear having a known number of teeth. A proximity detector detects the passing of gear teeth to provide a series of pulses. A series of pulses at a reference frequency originating from an oscillator is counted by a counter for the length of a sample period. The length of the sample period is determined by the passing of a preselected number of gear teeth past the proximity detector. At the end of the sample period, the number of pulses in the counter is stored in a latch. The count stored in the latch is entered into a programed divider. The programed divider counts down from the count in the latch to zero at the reference frequency. When the programed divider reaches zero, an output pulse is provided. Output pulses occur as the programed divider repeatedly counts the number stored in the latch, and the programed divider is updated with more recent information from the latch at the occurrence of each output pulse. The frequency of the series of pulses at the output of the divider is equal to the product of the count in the latch times the reciprocal of the reference frequency. The output may be provided to an electronic counter having a one-second time base to provide a direct reading of RPM.

DESCRIPTION OF THE PREFERRED EMBODIMENT

Figure 1:
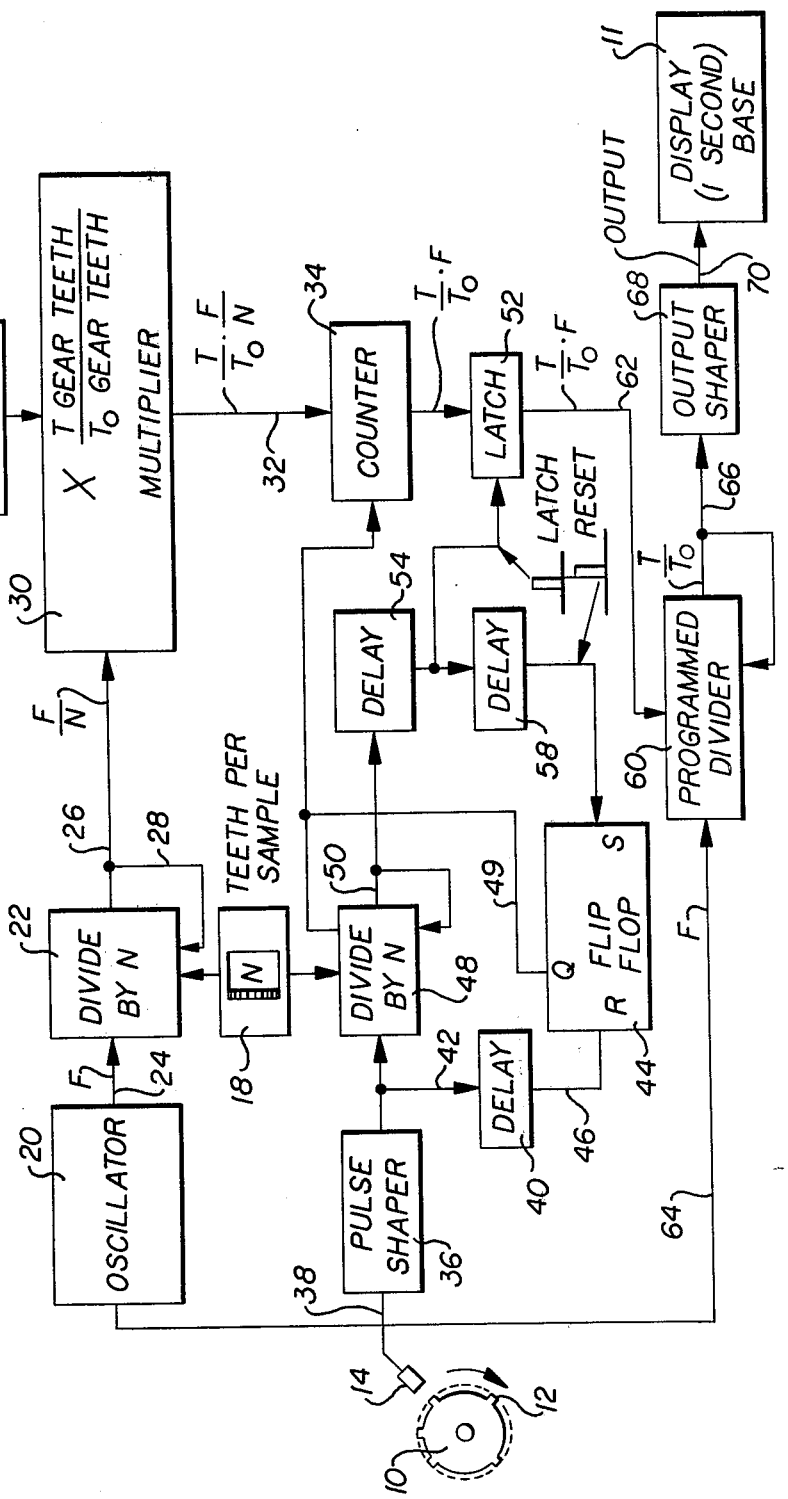
FIG. 1 is a block diagram of a system illustrating the invention.

Referring to FIG. 1, the velocity of a rotating gear 10, which may have any number of teeth, is to be measured and displayed as revolutions per minute on a digital counter 11 having a one-second time base. The circuit of FIG. 1 converts pulses derived from gear 10 to a series of equally spaced pulses equivalent to those which would be generated by a "standard" gear having sixty teeth and rotating at the same speed. A sixty-tooth gear is considered standard, as the pulses derived from it when displayed on a digital counter having a one-second time base give a reading directly in revolutions per minute. If a digital counter with a time base other than one second is used, a standard gear 10 will have a different number of teeth.

The passage of teeth 12 of gear 10 is detected by a proximity sensor 14 producing a series of pulses having a repetition rate representing the rotational velocity of the gear. Briefly, in accordance with the invention, a plurality of pulses from sensor 14 are counted to establish a sample period. The number of cycles of a reference signal which occur during the sample period is counted and used to generate the output signal. The pulse conversion system is set for the number of teeth on gear 10 by setting a numeric selector 16. The system is adjusted for the desired number of teeth per sample by selector 18. Both selectors 16 and 18 may be decimal thumb wheel switches.

Oscillator 20 provides a reference frequency, F, to the divide-by-N counter 22 by line 24. The divide-by-N counter 22 is a programed divider which has a single output pulse on line 26 after the occurrence of N number of pulses on line 24. N is entered by thumb wheel switch unit 18. The counter counts down from N and an output pulse is provided on line 26 when the divide-by-N counter 22 reaches zero. The output pulse also resets the counter 22 to N by line 28 when it reaches zero and the next countdown from N is started.

The output of the divide-by-N counter 22 has a frequency F/N and is multiplied by multiplier 30. The value set by multiplier 30 is equal to the proportion of T number of gear teeth 12 (as set by thumb wheel switch unit 16) divided by reference $T_o$, the number of teeth of a reference gear (60, in the case of a system using a digital display with a one-second time base). Multiplication of the signal on line 26 by this proportion generates a signal at a frequency $(F/N) \times (T/t_o)$, which is connected by line 32 to counter 34. Counter 34, a $2^{16}$ bit up-counter counts the pulses from multiplier 30 for a sample period, the length of which is related to the time it takes N gear teeth to pass detector 14. The same period begins with the movement of a tooth 12 past the proximity detector 14 and ends when N teeth, as set by thumb wheel switch unit 18, have passed the proximity detector 14. Counter 34 counts at the frequency $(F/N) \times (T/T_o)$ for a period of time required for N teeth of gear 10 to pass detector 14.

The output of proximity detector 14 is provided to pulse shaper 36 by line 38. Pulse shaper 36, a monostable multivibrator, assures that the pulses received from the proximity detector 14 are of even amplitude and width. The output of pulse shaper 36 is provided to delay circuit 40 (0.5μ second delay) by line 42 and the output of the delay 40 resets flip-flop 44 by line 46. Flip-flop 44 provides a single Q output pulse on line 49 to counter 34 upon the reception of the first pulse from detector 14 to start the sample period. Subsequent pulses provided to the flip-flop 44 on line 46 during the sample period do not affect the condition of flip-flop 44. The output of pulse shaper 36 also connects to divide-by-N circuit 48. Divide-by-N circuit 48, a programed divider, counts down from N to zero. N, the number of teeth per sample, is entered by thumb wheel switch unit 18. An output pulse is provided on line 50 to latch 52 through delay 54 (0.5μ second delay) when divide-by-N circuit 48 reaches zero. The occurrence of the output pulse represents the end of the sample period. The pulse from divide-by-N circuit 48 causes latch 52 to store the number of pulses counted by counter 34 at the time the pulse is received at latch 52. The occurrence of the output pulse at 50 also resets the divide-by-N circuit 48 to N. The number of pulses in the latch 52 at the end of the sample period is directly proportional to the length of the sample period. Also, the length of the sample period is a function of the selected number N and the speed of gear 12. The higher the number N, the longer the sample period. The faster the velocity of gear 12, the shorter the sample period. The size of counter 34 must be sufficient to preclude an overflow condition resulting from an extremely long sample period.

The signal from delay 54 is also provided to delay 58 (2μ second delay). The output of delay 58 sets flip-flop 44 and the Q output goes low. This resets counter 34 to zero and holds the divide-by-N circuit 48 and counter 34 in a reset condition until the next pulse is received from detector 14. This ensures that a full sample period will be measured instead of the sample period being occupied by the latch pulse or the reset pulse.

The count stored in latch 52 at the end of the sample period is available to the programed divider 60 by line 62. The programed divider 60 counts down from the count in the latch to zero and is clocked at a rate F from oscillator 20 by line 64. An output pulse is provided on line 66 when the programed divider 60 reaches zero. When an output pulse is provided on line 66, the programed divider 60 is reset to the latest available count in latch 52. If the next sample period has not ended, the programed divider 60 is provided with the same count as previously provided. At the end of each sample period, a new count is available to programed divider 60 from latch 52. Since the programed divider 60 is being clocked by frequency F on line 64, F is removed from the equation to provide equally spaced output pulses on line 66 proportional to $(T/T_o)$ times the speed of the rotating gear 10. Output shaper 68, a monostable multivibrator, provides pulses on output line 70 to digital counter 11 which are of even amplitude and width.

Figure 2:
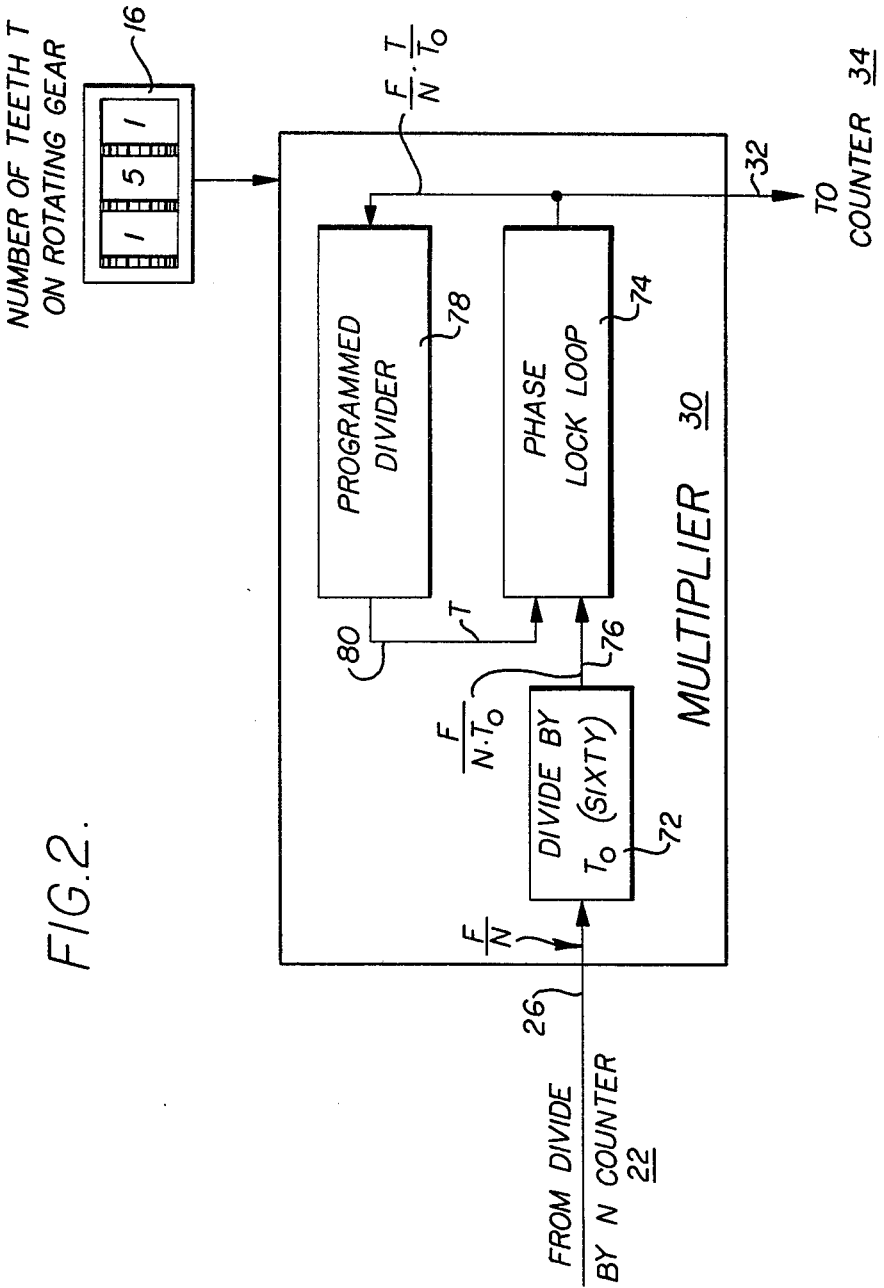
FIG. 2 is a block diagram of the multiplier circuit of FIG. 1.

Referring to FIG. 2, multiplier 30 is shown. The input of the multiplier is a series of pulses at the frequency F/N. The series of pulses on line 26 is divided by divide-by-$T_o$ (sixty) circuit 72 to provide $F/NT_o$. The output of the divide-by-$T_o$ (sixty) circuit 72 is provided to phase lock loop 74 by line 76. The phase lock loop 74 multiplies the signal $F/NT_o$ times T number of gear teeth as set by thumb wheel switch unit 16. Programed divider 78 counts down from T to zero and provides an output pulse on line 80 each time zero is reached. If the output is to be displayed as RPM on a one-second time base, the reference divisor $T_o$ is sixty. For other displays a different reference divisor will be used.

The selection of N determines the number of gear geeth 12 which must traverse the proximity detector 14 for a sample period. The accuracy of the instrument depends upon the number of pulses counted per sample. The larger N, the more accurate the count received and stored by latch 52. Conversely, the resolution of the instrument depends upon the number of sample periods obtained by the instrument per revolution of gear 10. The smaller N, the shorter the sample period. More samples can be acquired per revolution of the gear 10 with higher resolution. Hence, by selecting the number of teeth per sample period, the operator is allowed to select the optimum sample period to maintain the desired accuracy of the instrument without sacrificing resolution. The charge below provides an example of the setting of the thumb wheel switch unit 18 for gears having the number of teeth shown:

| TEST GEAR TEETH | TEETH PER SAMPLE |
| --- | --- |
| 181–200 | 10 |
| 161–180 | 9 |
| 141–160 | 8 |
| 121–140 | 7 |
| 101–120 | 6 |
| 81–100 | 5 |
| 61–80 | 4 |
| 41–60 | 3 |
| 21–40 | 2 |
| 1–20 | 1 |

The proximity detector 14 may be of any type capable of detecting the presence of a metal tooth. In lieu of the proximity detector 14, an optical device may be employed if, for example, the velocity of a nonmetallic gear is to be measured.

I claim:

1. A circuit for converting a first set of pulses into a second set of pulses, comprising:
   means for establishing a sample time period;
   a source of a first set of pulses;
   a counter coupled to said sample time period means and having an input connected to said source of first set of pulses, said counter counting the number of first pulses occurring within said sample period;
   storage means coupled to said sample counter;
   transfer means coupled to said sample counter for transferring the count from said counter to said storage means and to reset said counter at the end of said sample period;
   a source of a second set of pulses;
   programed divider means having a countdown circuit with an input connected to said source of a second set of pulses and a set input connected to said storage means, an output pulse being generated and said divider means being reset each time the pulses of said second set reduce the count of said set input to zero, said output pulses being equally spaced and the frequency of said output pulses being the count in said storage means multiplied by the magnitude of the reciprocal of the frequency of said second set of pulses.

2. The pulse converting circuit of claim 1, wherein said counter means is a digital counter.

3. The pulse converting circuit of claim 2, wherein said storage means is a digital latch circuit capable of storing the contents of said digital counter.

4. A method of multiplying a first set of pulses at a first frequency by a second set of pulses at a second frequency which comprises:

counting said first set of pulses for a time period to establish a count;

transferring said count to a memory;

utilizing the count in said memory to program a divider;

substracting pulses of said second set from the count in the divider;

generating an output when the count reaches zero; and resetting the divider and repeating the previous two steps, the generated output pulses being equally spaced and having a frequency equal to the count in the memory multiplied by the magnitude of the reciprocal of the second frequency.

* * * * *

UNITED STATES PATENT AND TRADEMARK OFFICE
CERTIFICATE OF CORRECTION

PATENT NO. : 4,268,792

DATED : May 19, 1981

INVENTOR(S) : Russel W. Grob

It is certified that error appears in the above-identified patent and that said Letters Patent are hereby corrected as shown below:

Column 2, line 58, delete "$(T/t_o)$" and substitute therefore --$(T/T_o)$--.

Column 4, line 7, delete "geeth" and substitute therefore --teeth--; and line 20, delete "charge" and substitute therefore --chart--.

Column 6, line 5, after "output" please insert --pulse--.

Signed and Sealed this

Fourth Day of August 1981

[SEAL]

Attest:

GERALD J. MOSSINGHOFF

Attesting Officer     Commissioner of Patents and Trademarks